US012578011B2

(12) United States Patent
Haake

(10) Patent No.: US 12,578,011 B2
(45) Date of Patent: Mar. 17, 2026

(54) PLANETARY TRANSMISSION HAVING AN IMPROVED LUBRICANT SUPPLY, DRIVE TRAIN AND WIND TURBINE

(71) Applicant: Flender GmbH, Bocholt (DE)

(72) Inventor: Norbert Haake, Dorsten (DE)

(73) Assignee: Flender GmbH, Bocholt (DE)

( * ) Notice: Subject to any disclaimer, the term of this patent is extended or adjusted under 35 U.S.C. 154(b) by 61 days.

(21) Appl. No.: 18/274,072

(22) PCT Filed: Feb. 9, 2022

(86) PCT No.: PCT/EP2022/053068
§ 371 (c)(1),
(2) Date: Jul. 25, 2023

(87) PCT Pub. No.: WO2022/179846
PCT Pub. Date: Sep. 1, 2022

(65) Prior Publication Data
US 2025/0020203 A1 Jan. 16, 2025

(30) Foreign Application Priority Data

Feb. 26, 2021 (EP) ..................................... 21159694

(51) Int. Cl.
*F03D 15/00* (2016.01)
*F03D 80/70* (2016.01)
(Continued)

(52) U.S. Cl.
CPC ........... *F16H 57/043* (2013.01); *F03D 15/00* (2016.05); *F03D 80/707* (2023.08); *F16H 1/46* (2013.01);
(Continued)

(58) Field of Classification Search
CPC ...... F16H 57/043; F16H 1/46; F16H 57/0486; F05B 2260/40311; F05B 2260/98; F03D 15/00; G06F 30/17
See application file for complete search history.

(56) References Cited

U.S. PATENT DOCUMENTS

2007/0289816 A1* 12/2007 Inoue .................... F16H 57/043
184/6
2012/0091725 A1* 4/2012 Yoshida .................. F03D 80/70
290/55
(Continued)

FOREIGN PATENT DOCUMENTS

DE 102010060147 * 4/2012 ............. F16H 57/04
EP 2597307 10/2012
(Continued)

OTHER PUBLICATIONS

International Search Report Issued by the European Patent Office on May 2, 2022 in International Application PCT/EP2022/053068.

*Primary Examiner* — Nathaniel E Wiehe
*Assistant Examiner* — Theodore C Ribadeneyra
(74) *Attorney, Agent, or Firm* — Henry M. Felereisen LLC

(57) ABSTRACT

A planetary transmission includes first and second planetary stages. At least one of the first and second planetary stages includes a transmission component. The planetary transmission further includes a pilot bearing, and a double-walled pipe received in the pilot bearing and having a central portion designed to have an outlet point for dispensing lubricant into the transmission component. A bushing is disposed in a region of the outlet point such that a gap is formed between the bushing and the transmission component.

11 Claims, 5 Drawing Sheets

(51) Int. Cl.
 F16H 1/46 (2006.01)
 F16H 57/04 (2010.01)
 G06F 30/17 (2020.01)
(52) U.S. Cl.
 CPC ......... F16H 57/0486 (2013.01); G06F 30/17
 (2020.01); *F05B 2260/40311* (2013.01); *F05B*
 *2260/98* (2013.01)

(56) References Cited

U.S. PATENT DOCUMENTS

| | | |
|---|---|---|
| 2017/0286572 A1 | 10/2017 | Hershey et al. |
| 2017/0356493 A1 | 12/2017 | Kruhoffer et al. |
| 2021/0277876 A1* | 9/2021 | Daners .................. F16H 37/041 |

FOREIGN PATENT DOCUMENTS

| | | |
|---|---|---|
| EP | 3396203 | 10/2018 |
| EP | 3798470 | 3/2021 |
| WO | WO 2020/001942 | 1/2020 |

* cited by examiner

PLANETARY TRANSMISSION HAVING AN IMPROVED LUBRICANT SUPPLY, DRIVE TRAIN AND WIND TURBINE

CROSS-REFERENCES TO RELATED APPLICATIONS

This application is the U.S. National Stage of International Application No. PCT/EP2022/053068, filed Feb. 9, 2022, which designated the United States and has been published as International Publication No. WO 2022/179846 A1 and which claims the priority of European Patent Application, Serial No. 21159694.5, filed Feb. 26, 2021, pursuant to 35 U.S.C. 119(a)-(d).

BACKGROUND OF THE INVENTION

The invention relates to a planetary transmission which possesses an improved lubricant supply. The invention also relates to a drive train that possesses a corresponding planetary transmission and a wind turbine that is equipped with such a drive train.

Known from EP 2 597 307 A1 is a device for transferring supply means through a drive train of a wind turbine, which includes a double-walled lead-through pipe that includes an inner and an outer pipe. The inner pipe and the outer pipe form an annular duct for lubricating oil. The inner pipe and the outer pipe are pushed onto end pieces by which a wall spacing is set between the outer and the inner pipe.

DE 10 2010 060 147 A1 discloses a planetary transmission with a central distributor which is designed as an annular duct. Lubricant is supplied via an inlet point disposed on the output side, said lubricant being fed to a planetary stage at an outlet point located further on the drive side. Positioned at the outlet point are seals made of PTFE, which are in contact with the central distributor.

WO 2020/001942 A1 discloses a planetary transmission which has three planetary stages connected in series. The planetary stages can be equipped with at least four, five, or even up to ten planet gears.

A planetary transmission with two planetary stages is known from EP 3 396 203 A1, in which a connecting shaft, a pilot bearing and a bearing flange are provided.

Known from US 2017/356493 A1 is a bushing which is disposed at an outlet point in a planetary transmission and is connected in a rotationally fixed manner to a planet gear bolt, with a gap being formed between the bushing and a transmission component.

Planetary transmissions are used in a multiplicity of technical fields in which increasing demands are made in terms of performance, reliability, service life and economy. Furthermore, inter alia, an efficient use of lubricants is aimed for. This applies in particular to planetary transmissions in wind turbines. The present invention is based on the object of providing a planetary transmission which offers a technical improvement in at least one of the outlined aspects.

SUMMARY OF THE INVENTION

The object is achieved by a planetary transmission according to the invention. The planetary transmission has at least a first and a second planetary stage, which are connected in series. The planetary transmission also has a double-walled pipe which is attached in a region of a main rotation axis of the planetary transmission. The double-walled pipe comprises an inner pipe and an outer pipe, by way of which an annular duct for a lubricant is formed. The inner pipe can be designed as a pitch pipe, for example, by way of which lines can be routed through the planetary transmission. When viewed along the main rotation axis, the double-walled pipe has a central portion in a central portion which is configured to dispense lubricant from the double-walled pipe into a transmission component. For this purpose, a bushing is disposed at the outlet point. The lubricant thus passes through the bushing when it is being dispensed to the transmission component. The bushing enables a low-leakage, almost leak-free transfer of the lubricant to the transmission component. A bushing is particularly durable, leakage-inhibiting and economical to manufacture. This enables an increased throughput of lubricant, which can be guaranteed by an increased delivery pressure in the lubricant, for example. As a result of the leakage-inhibiting effect of the bushing, any loss of lubricant that occurs in this way is minimized and is therefore still technically acceptable. As a result, improved lubrication and/or cooling can thus be achieved for transmission components, for example for friction bearings of planet gears or spray lubrication of toothings. This in turn allows the planetary transmission to be subjected to an increased operating load. The bushing according to the invention thus serves to increase the performance of the planetary transmission according to the invention. The bushing per se can have relatively small dimensions and thus allow an economical use of correspondingly suitable materials such as bronze, from which the bushing can be made. Alternatively, the bushing can also be made of a non-sliding material, for example a steel alloy, cast iron, aluminum, an aluminum alloy or a fiber composite material such as glass fiber-reinforced plastic, carbon fiber-reinforced plastic, aramid fiber-reinforced plastic, or a combination thereof.

In addition, the planetary transmission in the region of the outlet point, in the central portion, has a pilot bearing which is configured to set a gap on the bushing. The pilot bearing, which can be designed as a roller bearing, for example, is positioned in such a manner that it is supported on the transmission component into which lubricant is to be dispensed by way of the outlet point. For this purpose, the pilot bearing can be positioned adjacent to the bushing. In particular, the bushing and the pilot bearing can be disposed in the region of an inside of a hub of a planet carrier of the second planetary stage. Such pilot bearings are readily available in a variety of sizes and provide a high degree of alignment precision for the double-walled pipe, particularly for its outer pipe. At the same time, such a pilot bearing allows relative rotation between the double-walled pipe and the corresponding transmission component in relation to the main rotation axis. When the planetary transmission is subject to increased stress, bending stresses can occur in the region of the central portion of the double-walled pipe. This can disrupt the gap at the bushing. In particular, the gap can be narrowed radially on one side and widened radially on an opposite side, which in turn leads to increased loss of lubricant. The closer the pilot bearing is disposed axially to the bushing, the more displacements, for example axial offsets or radial offsets, which lead to disruption of the gap, can be avoided. This makes it possible to increase the load capacity of the claimed planetary transmission in a simple manner.

According to the invention, the gap is configured at the outlet point between the bushing and the transmission component. In normal operation, lubricant enters the gap so that there is no direct contact between the transmission component and the bushing. The gap has a minimized gap height, i.e. radial dimension. The minimized gap height reduces loss of lubricant at the gap. Due to the fact that the bushing has a relatively small external diameter, the tolerances that have to be maintained in order to achieve a minimized gap are more favorable in relation to the overall dimensions, in particular to the external diameter of the bushing. This allows the bushing to be manufactured in a cost-effective manner. Furthermore, a relative movement between the transmission component and the bushing in an axial direction can be compensated in this way.

In an embodiment of the claimed planetary transmission, the gap may be configured on an external face of the bushing. As a result, the bushing is connected in a rotationally fixed manner to the double-walled pipe, in particular its inner pipe. This simplifies assembling of the bushing. In particular, assembling in which the bushing is installed on its external face by way of an interference fit can be avoided. As a result, the maintenance and repair friendliness of the claimed planetary transmission is increased.

In addition, a bearing bushing can be disposed on the outer pipe of the double-walled pipe. The bearing bushing surrounds the double-walled pipe and has a substantially radially aligned opening which allows passage of the lubricant. The bearing bushing can be connected in a rotationally fixed manner to the double-walled pipe and thus implement the rotatably fixed connection of the bushing to the double-walled pipe. The bearing bushing in terms of construction can be adapted in a simple manner, particularly in terms of radial dimensions. As a result, the bushing can be designed to save material. A radial spacing between the double-walled pipe and the transmission component into which the lubricant is to be dispensed from the outlet point can be at least partially bridged by the bearing bushing. Accordingly, the use of expensive materials such as bronze for the bushing can be minimized. The bearing bushing can be configured so as to be releasable, that is to say substantially releasable in a non-destructive manner. This makes it possible to manufacture the bearing bushing with increased precision in a simple manner. Moreover, the bearing bushing can be configured to be axially movable, so that, for example, an axial offset of the double-walled pipe can be compensated for during operation of the planetary transmission.

Furthermore, the bearing bushing can be received in an inner race of the pilot bearing. Correspondingly, an outer race of the pilot bearing can be disposed on the transmission component into which the lubricant is to be dispensed from the outlet point. The bearing bushing can be easily adjusted in the radial direction in a region in which the inner race of the pilot bearing is disposed. As a result, a radial position of the bushing can be selected independently of the dimensions of the pilot bearing. In interaction with the transmission component, the bearing bushing can consequently be adapted to the dimensions of an existing pilot bearing. The pilot bearing can therefore be configured as a standardized part from a series of standardized parts of fixed, predetermined size increments. As a result, a cost-efficient standardized part can be used as the pilot bearing, and at the same time the bushing can be designed independently of the requirements of the gap between the bushing and the transmission component. This achieves an increased sealing effect at the gap and, at the same time, increased cost efficiency. Moreover, the pilot bearing can be releasably fastened to the transmission component, for example via a retaining ring. A shrink-fit or an adhesive bond of the pilot bearing is not necessary as a result, which allows a simplified assembly and maintenance. Furthermore, the double-walled pipe can be selected substantially independently of the size of the pilot bearing. Compared to solutions from the prior art, the dimensioning of the double-walled pipe is not determined by the sizes and size increments in which the pilot bearing is available.

In a further embodiment of the claimed planetary transmission, the bushing can be attached to the bearing bushing, i.e. substantially on its external face. In this case, the bushing can be attached to the bearing bushing, for example by a shrink-fit. Such a connection between the bushing and the bearing bushing offers an increased sealing effect between them. Likewise, variations in the roundness of the bearing bushing, in particular on its external face, can be at least partially compensated for in this way. In this case, the bushing can also be disassembled and the bearing bushing together with the bushing can be replaced by a replacement part, substantially in a modular manner.

Furthermore, the transmission component may comprise a mating bushing that substantially surrounds the bushing. As a result, the gap on the bushing is configured between the bushing and the mating bushing. Furthermore, the pilot bearing, in particular its outer race, can be received in the mating bushing. The bearing bushing, the bushing and the mating bushing can thus be adapted to one another separately and conjointly form a lubricant transfer module. This allows precise and at the same time cost-efficient production. In particular, the bushing and/or the mating bushing can be manufactured in a targeted manner with higher precision in the region of the gap. Wider tolerances can be selected for other regions, which still offer sufficient ease of assembly. Complex surface machining operations, which can be used to minimize loss of lubricant at the gap, can be carried out in a locally delimited manner, and are therefore cost-efficient. The principle of need-based production is thus further implemented. The lubricant transfer module can be installed as an entity, i.e. in a modular manner. The manufacture and maintenance of the claimed planetary transmission are thus further simplified. Furthermore, such a mating bushing allows for a simplified routing of lubricant and further simplifies the production of the claimed planetary transmission.

Furthermore, the claimed planetary transmission in the first planetary stage can have at least five planet gears, preferably five to twelve, more preferably seven to ten, planet gears. Alternatively or additionally, the second planetary stage can have at least four planet gears, preferably six or seven planet gears. The more planet gears are disposed in a planet carrier of a planetary stage, the more lubricant is required in the corresponding planetary stage. The use of a bushing according to the invention makes it possible to minimize the loss of lubricant with an increased throughput of lubricant. In this way, in particular, an increase in the throughput of lubricant can be generated without increasing the delivery pressure or the total volume of conveyed lubricant. The delivery pressure is substantially limited by the fact that foaming can occur if the delivery pressure is too high, for example on flat jet nozzles. The lubricant delivery volume is substantially limited by the delivery rate of a lubricant pump. The planetary transmission can consequently be made more powerful with an increased number of planet gears in the planetary stages. Corresponding planetary transmissions are disclosed in European patent application EP 3 587 863 A1, the disclosed content of which is incorporated by reference into the present application.

Furthermore, the second planetary stage, in the region of which the outlet point is configured in the central region of the double-walled pipe, can be disposed between the first planetary stage and a third planetary stage. The claimed solution makes it possible to provide a reliable, low-leakage and at the same time efficient supply of lubricant for planetary stages which are disposed in an axially inner region of a planetary transmission. Because a bushing is used that does not come into direct contact with the transmission component, there is also no technically relevant wear and tear that would require frequent inspections of the outlet point. The claimed planetary transmission can therefore have three or more planetary stages or further spur gear stages, by way of which the second or further inner planetary stage is accessible only with difficulty. As a result, complex planetary transmissions with an increased number of planetary stages can be manufactured in a technically feasible manner and operated economically.

In a further embodiment of the claimed planetary transmission, the transmission component to which the lubricant is to be dispensed can be a planet carrier, for example a planet carrier of the second planetary stage. When the planetary transmission is in operation, there can be relative rotation between a planet carrier and a double-walled pipe, the latter serving, for example, as a pitch pipe. The bushing according to the invention allows lubricant to be transferred at least with little leakage, which allows efficient supply of lubricant to planet gear bearings, for example friction bearings, or planet carrier bearings, which are also referred to as lubricant consumers. The planet carrier can have a plurality of bores, which enable the lubricant to be transported to the corresponding lubricant consumers substantially without loss. Alternatively, the transmission component can also be a sun gear of the planetary transmission, and thus, for example, supply lubricant to a toothed engagement between the sun gear and the planet gears meshing with it. The larger the outer diameter of the sun gear, the more the outlined technical advantages emerge. Consequently, a multiplicity of lubricant consumers can also be reliably supplied with lubricant in the claimed planetary transmission, and thus in a complex lubricant system.

In addition, an outlet point can be formed in the claimed planetary transmission in the region of a first end of the double-walled pipe. The outlet point at the first end of the double-walled pipe is configured to supply the first planetary stage with lubricant, for example planet gear bearings, which can be designed as friction bearings or roller bearings in the planet carrier, toothings in the first planetary stage, and/or bearings in which the planet carrier is mounted, i.e. planet carrier bearings. For this purpose, the outer and/or the inner pipe of the double-walled pipe can be connected in a rotationally fixed manner to the planet carrier of the first planetary stage. Alternatively, the double-walled pipe can also be fixed in a rotationally fixed manner to any other rotating or stationary transmission component. As a further alternative, the double-walled pipe can also be designed so that it can rotate loosely in the planetary transmission. As a result, there is no relative rotation between the planet carrier of the first planetary stage and the double-walled pipe. Accordingly, the outlet point can be sealed at the first end via at least one grooved ring. Grooved rings only exert reduced restoring forces in the axial and radial directions, so that the pilot bearing is only subjected to reduced mechanical stress during operation. The reduced restoring forces exerted in this way can be brought about by the weight of a transmission component and act substantially continuously in the claimed planetary transmission. As a result, a minimum load can be provided for a roller bearing. This in turn also allows the use of simple pilot bearings with reduced load capacity. The at least one grooved ring consequently serves to reduce an axial load on the pilot bearing and/or to increase the usable service life of the pilot bearing.

Moreover, an inlet bushing can be disposed on a second end of the double-walled pipe. The second end can lie at an end of the double-walled pipe that faces away from the first planetary stage. An inflow of lubricant takes place through the inlet bushing, which lubricant is fed to the planetary transmission via the outlet points in the central portion, optionally at the first end. According to one of the embodiments of the bushing, the inlet bushing can be formed at the outlet point in the central portion. The inlet bushing is disposed between the outer pipe and a housing wall of the planetary transmission, with an inlet bore for the lubricant being formed in the housing wall. In particular, a gap can be formed between the inlet bushing and the double-walled pipe. Accordingly, a reliable and low-leakage supply of lubricant for the double-walled pipe is implemented.

The underlying object is also achieved by the drive train according to the invention. The drive train includes a main shaft which is connectable to a multi-blade rotor of a wind turbine. The main shaft is coupled in a torque-transmitting manner to a transmission, which in turn is connected in a torque-transmitting manner to a generator. As a result, a rotation of the multi-blade rotor can be converted into a rotation of the generator and electricity can be generated. The drive train is configured to be received in a nacelle of a wind turbine. According to the invention, the transmission in the drive train is configured as a planetary transmission according to at least one of the embodiments outlined above.

Likewise, the object on which the invention is based is achieved by the wind turbine according to the invention. The wind turbine has a nacelle to which a multi-blade rotor is rotatably fastened. A drive train which is connected in a torque-transmitting manner to the multi-blade rotor is received in the nacelle. The drive train here is configured according to one of the embodiments presented above.

The object described is also achieved by a computer program product according to the invention, which is designed to simulate an operating behavior of a planetary transmission, that is to say is specified for this purpose. According to the invention, the planetary transmission to be simulated is designed according to one of the embodiments described above. The computer program product can have a physics module for simulation purposes, in which the planetary transmission is mapped and, for example, the mechanical or thermal behavior of the latter can be reproduced under adjustable operating conditions. For example, the adjustable operating conditions include a speed, a lubricant temperature, a pressure in the lubricant, or its thermal behavior, such as inter alia a temperature-dependent viscosity characteristic, and/or an axial displacement and/or radial displacement of a double-walled pipe. To this end, the computer program product can possess a data interface via which corresponding data can be defined via user input and/or other simulation-oriented computer program products. The computer program product can also possess a data interface for outputting simulation results to a user and/or other simulation-oriented computer program products. Using the computer program product, for example, measurement data from sensors on the planetary transmission, an associated drive train, or on a wind turbine can be verified for plausibility. This allows, inter alia, a defective sensor to be identified. The computer program product can be configured as a so-called digital twin, as described in more detail in publication US 2017/286572 A1, for example. The disclosure content of US 2017/286572 A1 is incorporated into the present application by reference. The computer program product can be of a monolithic configuration, that is to say it can be executed completely on a hardware platform.

Alternatively, the computer program product can be of modular configuration and comprise a number of sub-programs that can be executed on separate hardware platforms and interact via a communicative data connection. Such a communicative data connection can be a network connection or an Internet connection. In particular, the computer program product can be configured to be executable in a computer cloud. Furthermore, the computer program product according to the invention can be used to test and/or optimize a planet carrier arrangement by simulation.

BRIEF DESCRIPTION OF THE DRAWING

The invention will be discussed in more detail below on the basis of individual embodiments in figures. The figures are to be viewed in a mutually complementary manner insofar as the same reference signs in different figures have the same technical meaning. The features of the individual embodiments can also be combined with one another. Furthermore, the embodiments shown in the figures can be combined with the features outlined above. In the figures, specifically.

DETAILED DESCRIPTION OF PREFERRED EMBODIMENTS

Figure 1:
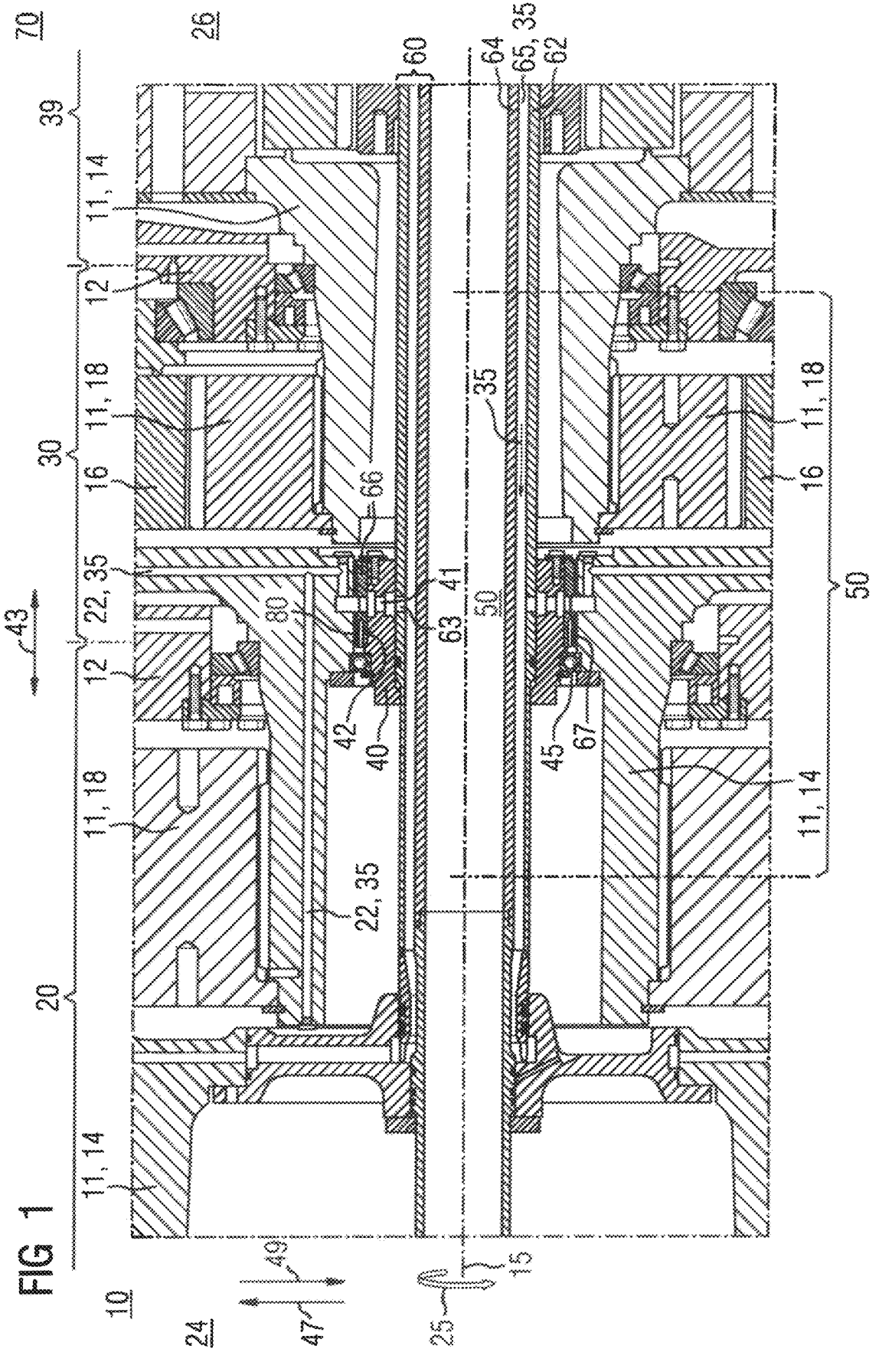
FIG. 1 schematically shows a first embodiment of the claimed planetary transmission in the longitudinal section.

A first embodiment of the claimed planetary transmission 10 is shown in FIG. 1 in the longitudinal section. The planetary transmission 10 is configured to transport a drive output 25 from a drive side 24 to an output side 26 by rotating about a main rotation axis 15. For this purpose, the planetary transmission 10 comprises a first planetary stage 20 and a second planetary stage 30, which are disposed in series along an axial direction 43. This is followed by a third planetary stage 39 (not shown in detail). Both the first and the second planetary stage 20, 30 each have transmission components 11 which are received in a housing 12. The transmission components 11 include planet carriers 14, in each of which planet gears are rotatably received and which interact with a sun gear 18 for each planetary stage 20, 30. The sun gear 18 in the first planetary stage 20 is connected to the planet carrier 14 of the second planetary stage 30. Furthermore, the transmission components 11 also include a ring gear, not shown in detail, for each planetary stage 20, 30, in which ring gear the planet gears 16 can roll. A double-walled pipe 60, which extends through the planetary transmission 10 in the axial direction 43 and serves as a so-called pitch pipe, is disposed in the region of the main rotation axis 15. The double-walled pipe 60 comprises an outer pipe 62 and an inner pipe 64, between which is configured an annular duct 65 through which a lubricant 35 is conveyed during operation. The lubricant 35 is to be supplied to transmission components 11 in order to ensure long-term low-wear operation. For this purpose, the outer pipe 62 possesses an outlet point 63 which allows the lubricant 35 to escape substantially in an outer radial direction 47. The outlet point 63 is positioned in a central portion 50 of the double-walled pipe 60, where the first planetary stage 20 adjoins the second planetary stage 30.

A bearing bushing 40 is disposed in the region of the outlet point 63 and is connected in a rotationally fixed manner to the outer pipe 62 and thus to the double-walled pipe 60. The bearing bushing 40 has a bearing bushing opening 41 which guarantees that the lubricant 35 can pass through. The bearing bushing 40 is also rotatably received in a pilot bearing 45, which in turn is attached to the surrounding transmission component 11, i.e. the planet carrier 14 of the second planetary stage 30. The planet carrier 14 of the second planetary stage 30, like the double-walled pipe 60, rotates about the main rotation axis 15 during operation. During operation, there is a relative rotation between the double-walled pipe 60 and the transmission component 11 on which the pilot bearing 45 is disposed, the pilot bearing 45 following said relative rotation. A bushing 66 is disposed in a rotationally fixed manner on an external face 42 of the bearing bushing 40 and is designed to correspond to the bearing bushing 40 in order to allow lubricant 35 to pass through to the transmission component 11. A gap 80 is configured between the bushing 66 and the transmission component 11 in which the pilot bearing 45 is disposed, i.e. the planet carrier 14 of the second planetary stage 30. There is therefore no direct contact between an external face 67 of the bushing 66 and the planet carrier 14 of the second planetary stage 30. The gap 80 is dimensioned in such a manner that a loss of lubricant 35 is minimized therein. The transmission component 11 is provided with a plurality of lubricant ducts 22 which are hydraulically coupled to the gap 80, the bushing 66, the bearing bushing 40 and the annular duct 65 in the double-walled pipe 60. Lubricant 35 can be routed via the lubricant ducts 22 to further transmission components 11, for example planet gears 16, for lubrication and/or cooling.

The pilot bearing 45 guides the bearing bushing 40 in an outer and inner radial direction 47, 49 in relation to the transmission component 11, i.e. the planet carrier 14 of the second planetary stage 30, the gap 80 being set as a result. The bearing bushing 40 can be easily adjusted in the region of the pilot bearing 45 so that the pilot bearing 45 can be selected substantially independently of the dimensions of the double-walled pipe 60. Consequently, an optimized pilot bearing 45 can be selected for the planetary transmission 10, which ensures reduced lubricant losses for the gap 80. The planetary transmission 10 is furthermore depicted in a computer program product 70 not shown in detail, which is designed to simulate the planetary transmission 10.

Figure 2:
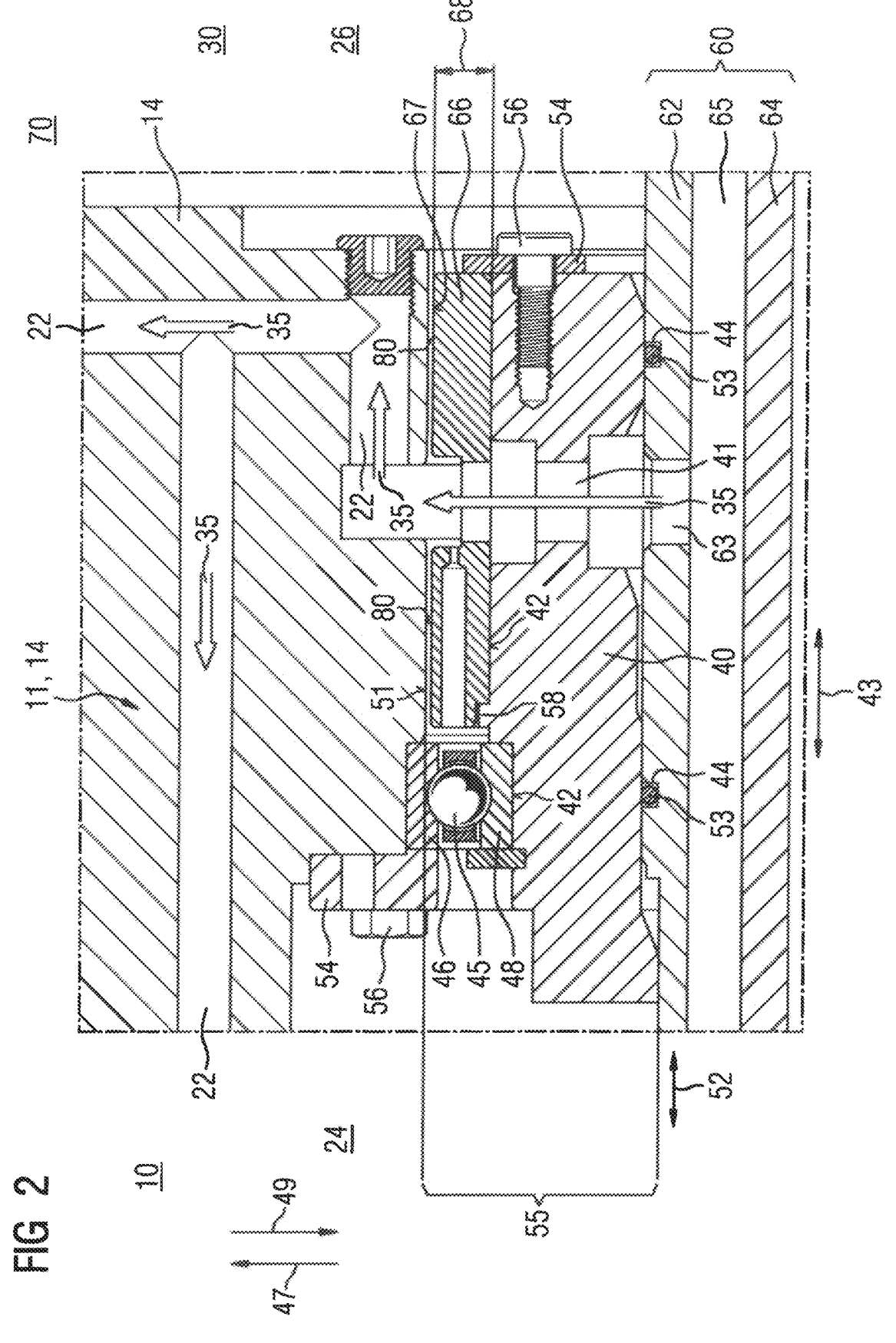
FIG. 2 shows a detailed view of the first embodiment of the claimed planetary transmission in the longitudinal section.

The embodiment according to FIG. 1 is shown in more detail in a detailed diagram in FIG. 2. Accordingly, FIG. 1 and FIG. 2 are to be perused as complementing one another. Configured on the outer pipe 62 of the double-walled pipe 60 are grooves 44 in which are disposed sealing elements 53 that are configured as O-rings. A seal between the bearing bushing 40 and the double-walled pipe 60, which substantially prevents the escape of lubricant 35, is achieved via the sealing elements 53. The sealing elements 53 allow an axial offset 52 between the bearing bushing 40 and the double-walled pipe 60. As a result, mechanical stress on the pilot bearing 45 in the axial direction 43 is reduced, resulting in an increased usable service life for the pilot bearing 45. The bearing bushing 40 is thus furthermore releasably connected to the double-walled pipe 60, that is to say it can be detached in a substantially non-destructive manner. A bearing bushing opening 41 is configured opposite the outlet point 63 of the double-walled pipe 60 and allows lubricant 35 to pass through from the annular duct 65 in the double-walled pipe 60 in an outer radial direction 47. Disposed on the external face 42 of the bearing bushing 40 is the bushing 66 which can be made of a sliding material, such as bronze. Owing to the bearing bushing 40, the bushing 66 in terms of construction can be designed substantially independently of the dimensions of the double-walled pipe 60. In particular, the bushing 66 can only be designed to meet the requirements of the gap 80 between the former and an inner face 51 of the transmission component 11 on which the pilot bearing 45 is disposed. Consequently, the bushing 66 has a reduced wall thickness 68. The bushing 66 is releasably disposed on an external face 42 of the bearing bushing 40 and is positioned on the bearing bushing 40 in a form-fitting manner by means of a stop 58 and a holding element 54 with a fastening means 56. The gap 80 between the external face 67 of the bushing 66 and the transmission component 11, i.e. the planet carrier 14 of the second planetary stage 30, is set by the pilot bearing 45, which is disposed adjacent to the bushing 66. The pilot bearing 45 comprises an outer race 46 which bears on the transmission component 11 and an inner race 48 which bears on the bearing bushing 40 and thus allows relative rotation between the bearing bushing 40 and the transmission component 11. The external face 42 of the bearing bushing 40 adjacent to the bushing 66 can be sized in such a manner that the pilot bearing 45 is substantially independently selectable. The pilot bearing 45 is accordingly selected in an optimized manner so that the loss of lubricant at the gap 80 is minimized. The pilot bearing 45 is positioned by a holding element 54 with a fastening means 56 and is consequently releasably connected to the transmission component 11, that is to say releasable in a substantially non-destructive manner. The holding element 54 also serves as an anti-rotation safeguard. As a result, the pilot bearing 45 can be disassembled in a simple manner. The bearing bushing 40 and the bushing 66 are included in a lubricant transfer module 55, which can also be exchanged as such. The maintenance of the planetary transmission 10 is therefore further simplified. The operating behavior of the planetary transmission 10, in particular a flow behavior of the lubricant 35 in the region of the bearing bushing 40 and/or the bushing 66, and/or an axial offset 52 between the double-walled pipe 60 and the transmission component 11, can be simulated by a computer program product 70 (not shown in detail).

Figure 3:
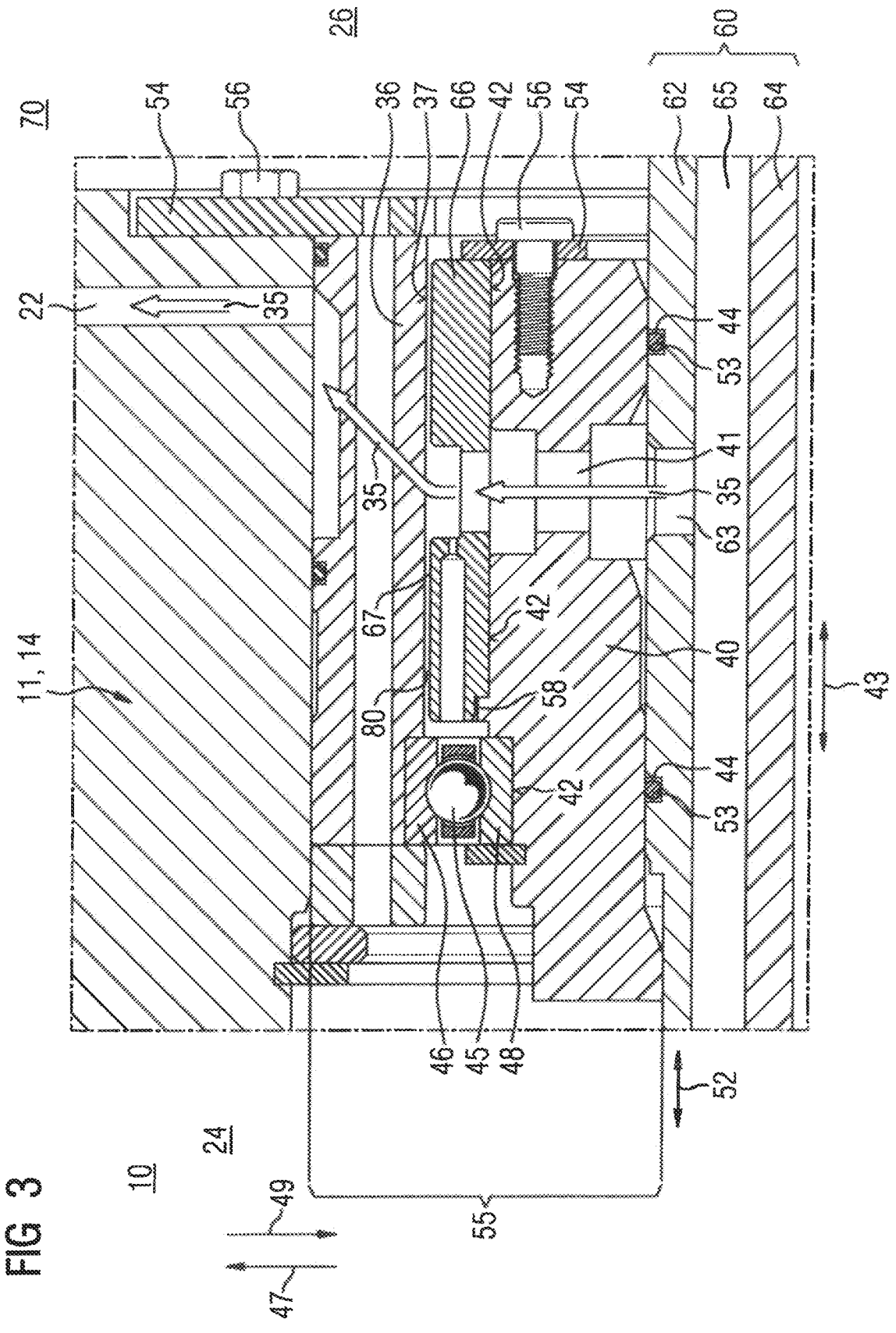
FIG. 3 shows a detailed view of a second embodiment of the claimed planetary transmission in the longitudinal section.

A second embodiment of the claimed planetary transmission 10 is shown in a detailed view in the longitudinal section in FIG. 3. Disposed therein, on the outer pipe 62 of the double-walled pipe 60, is a bearing bushing 40 which is connected to the double-walled pipe 60 in a rotationally fixed manner. Grooves 44, in which sealing elements 53 which are formed as O-rings are disposed, are configured on the outer pipe 62. This allows an axial offset 52 between the double-walled pipe 60 and the bearing bushing 40. A bearing bushing opening 41 is formed in the bearing bushing 40 and allows lubricant 35 to pass through from the annular duct 65 in the double-walled pipe 60 into the transmission component 11. A bushing 66 is disposed on an external face 42 of the bearing bushing 40 and can be made of a sliding material, for example bronze. Adjacent to the bushing 66 is the pilot bearing 45 which comprises an outer race 46 and an inner race 48. The outer race 46 of the pilot bearing 45 is disposed on a mating bushing 36 having an inner face 37 positioned opposite an external face 67 of the bushing 66. A gap 80 is defined by the inner face 37 of the mating bushing 36 and the external face 67 of the bushing 66 and is set by the pilot bearing 45. The gap 80 is configured in such a manner that a loss of lubricant at the gap 80 is minimized. The bushing 66 is connected in a rotationally fixed manner to the bearing bushing 40 and accordingly follows a rotation of the double-walled pipe 60. The mating bushing 36 is connected in a rotationally fixed manner to the transmission component 11, i.e. the planet carrier 14 of the second planetary stage 30. Accordingly, there is a relative rotation between the bushing 66 and the mating bushing 36 at the gap 80 during operation of the planetary transmission 10. The bushing 66 is releasably positioned via a stop 58 on the bearing bushing 40 and a holding element 54 with a fastening means 56. Analogously, the mating bushing 36 is releasably connected to the transmission component 11 via a holding element 54 with a fastening means 56. The mating bushing 36 is also designed for a further passage of the lubricant 35 so that the lubricant 35 can be passed on via a lubricant duct 22 in the transmission component 11. The bearing bushing 40 with the bushing 66 and the mating bushing 36 conjointly form a lubricant transfer module 55 which can be easily replaced. Accordingly, maintenance of the planetary transmission 10 according to FIG. 3 is simplified. The operating behavior of the planetary transmission 10 according to FIG. 3 can also be simulated by a computer program product 70 that is not shown in detail.

Figure 4:
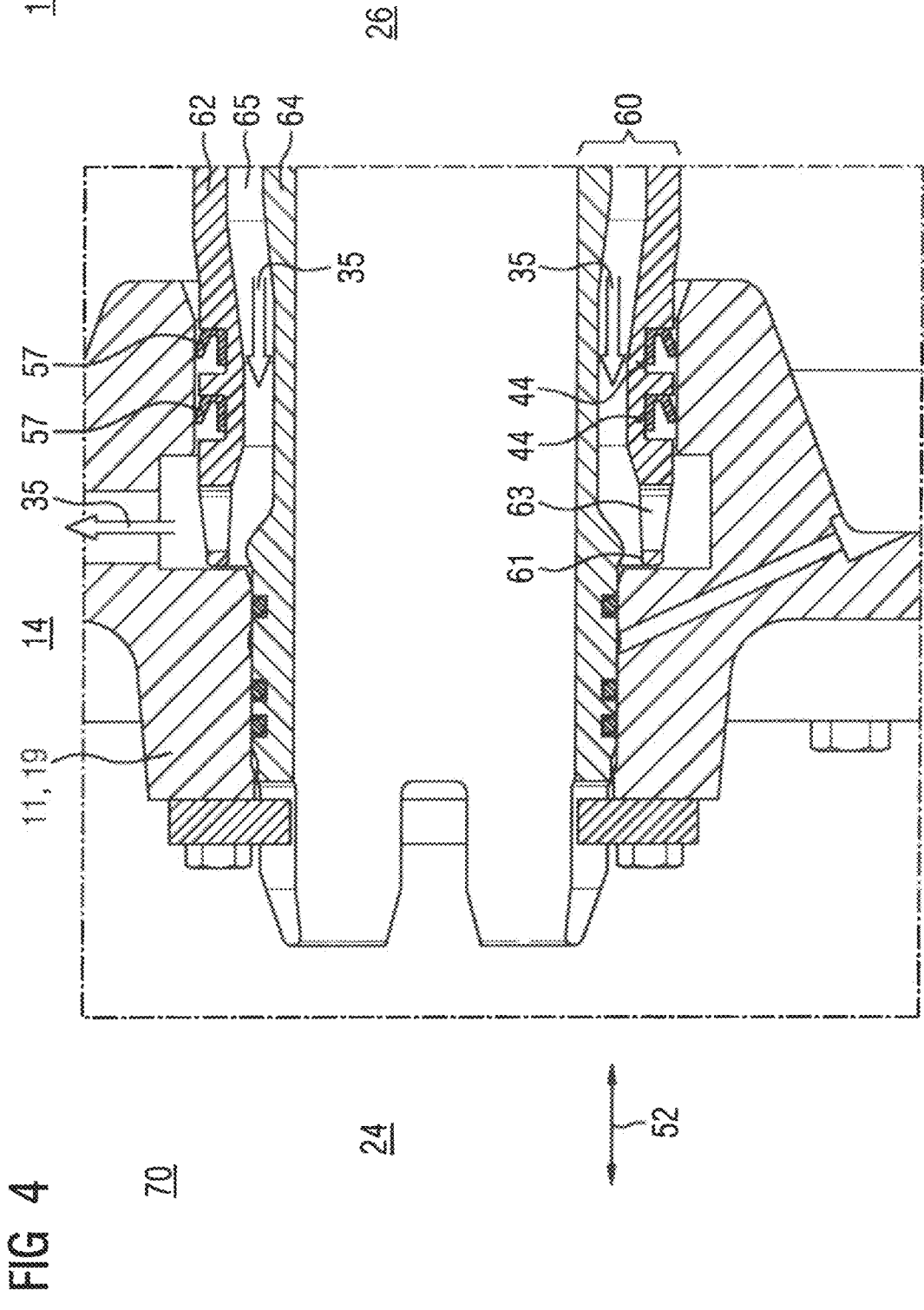
FIG. 4 shows a detailed view of a third embodiment of the claimed planetary transmission in the longitudinal section.

A third embodiment of the claimed planetary transmission 10 is shown schematically in a detailed view in the longitudinal section in FIG. 4. FIG. 4 shows the double-walled pipe 60 with the outer pipe 62 and the inner pipe 64 in a region of a first end 61 which faces a drive side 24. In the region of the first end 61 the double-walled pipe 60 is coupled to a cover 19 which is to be considered a transmission component 11. The cover 19 is connected to a planet carrier 14 of a first planetary stage 20. In the region of the first end 61, the outer pipe 62 possesses an outlet point 63, via which the lubricant 35 can be dispensed into the cover 19. Adjacent to the outlet point 63, grooves 44 in which grooved rings 57 are disposed are configured on the outer pipe 62. A seal between the cover 19 and the outer pipe 62 of the double-walled pipe 60 is established by the grooved rings 57. The grooved rings 57 are also configured to allow an axial offset 52 and/or a radial offset between the outer pipe 62 and the cover 19. As a result, mechanical stress on a pilot bearing 45 (not shown in detail) during operation of the planetary transmission 10 is reduced. As a result, the technical advantages of the claimed planetary transmission 10 are implemented to a greater extent. The behavior of the outer pipe 62, in particular of the axial offset 52 that occurs thereon, is part of the operating behavior of the planetary transmission 10, which can be simulated by a computer program product 70 that is not shown in any more detail.

Figure 5:
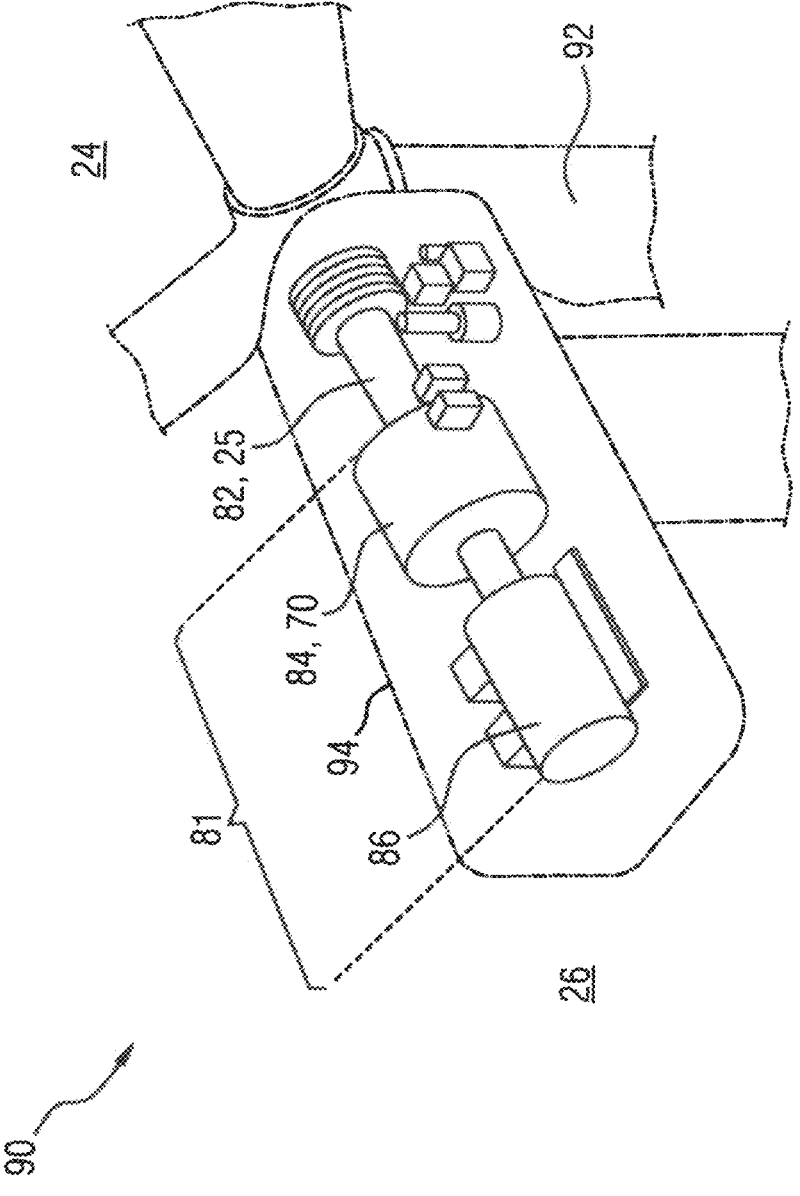
FIG. 5 schematically shows the construction of an embodiment of the claimed wind turbine in a sectional oblique view.

An embodiment of a claimed wind turbine 90 is shown schematically in a sectional oblique view in FIG. 5. The wind turbine 90 comprises a nacelle 94 to which a multi-blade rotor 92 by way of which a drive output 25 can be provided is rotatably attached. The multi-blade rotor 92 is disposed on a drive side 24 and connected to a main shaft 82 by way of which the drive output 25 is supplied to a drive train 81 which is received in the nacelle 94. In addition to the main shaft 82, the drive train 81 comprises a transmission 84, said transmission and main shaft being connected to one another in a torque-transmitting manner. The transmission 84 is connected in a torque-transmitting manner to a generator 86 on an output side 26. The transmission 84 has a first and a second planetary stage 20, 30 and is configured as a planetary transmission 10 according to one of the embodiments outlined above. Furthermore, the planetary transmission 10 is depicted in a computer program product 70 configured to simulate the operation of the planetary transmission 10 in the wind turbine 90.

What is claimed is:

1. A planetary transmission, comprising:

first and second planetary stages, at least one of the first and second planetary stages comprising a transmission component;

a pilot bearing;

a double-walled pipe received in the pilot bearing and having a central portion designed to have an outlet point for dispensing lubricant into the transmission component;

a bushing disposed in a region of the outlet point such that a gap is formed between the bushing and the transmission component;

a bearing bushing rotatably received in the pilot bearing and disposed on an outer pipe of the double-walled pipe and located between the double-walled pipe and the bushing; and a bearing bushing opening in communication with the outlet port.

2. The planetary transmission of claim 1, wherein the bushing includes an external face, said gap being formed on the external face of the bushing.

3. The planetary transmission of claim 1, wherein the bearing bushing is received in an inner race of the pilot bearing.

4. The planetary transmission of claim 1, wherein the bushing is attached to the bearing bushing.

5. The planetary transmission of claim 1, wherein the first planetary stage comprises at least five planet gears and/or the second planetary stage comprises at least four planet gears.

6. The planetary transmission of claim 1, further comprising a third planetary stage, said second planetary stage being disposed between the first planetary stage and the third planetary stage.

7. The planetary transmission of claim 1, wherein the transmission component to which the lubricant is to be dispensed is a planet carrier.

8. A drive train for a wind turbine, said drive train comprising:

a generator;

a transmission connected in a torque-transmitting manner to the generator, said transmission being designed as the planetary transmission of claim 1; and a main shaft connected in a torque-transmitting manner to the transmission.

9. A wind turbine, comprising:

a nacelle;

a multi-blade rotor rotatably attached to the nacelle; and a drive train received in the nacelle, said drive train comprising a generator, a transmission connected in a torque-transmitting manner to the generator, said transmission being designed as the planetary transmission of claim 1, and a main shaft connected in a torque-transmitting manner to the transmission.

10. A planetary transmission comprising:

first and second planetary stages, at least one of the first and second planetary stages comprising a transmission component;

a pilot bearing;

a double-walled pipe received in the pilot bearing and having a central portion designed to have an outlet point for dispensing lubricant into the transmission component;

a bushing disposed in a region of the outlet point such that a gap is formed between the bushing and the transmission component; and a mating bushing disposed on the transmission component such that the gap is formed between the mating bushing and the bushing.

11. A planetary transmission, comprising:

first and second planetary stages, at least one of the first and second planetary stages comprising a transmission component;

a pilot bearing;

a double-walled pipe received in the pilot bearing and having a central portion designed to have an outlet point for dispensing lubricant into the transmission component; and a bushing disposed in a region of the outlet point such that a gap is formed between the bushing and the transmission component wherein the double-walled pipe comprises a further outlet point formed in a region of a first end of the double-walled pipe, and further comprising a grooved ring designed to seal the further outlet point.

* * * * *